United States Patent
Shih et al.

(10) Patent No.: US 7,456,945 B2
(45) Date of Patent: *Nov. 25, 2008

(54) PHOTONIC DEVICE PACKAGE WITH ALIGNED LENS CAP

(75) Inventors: Robert Shih, Arcadia, CA (US); Chun Lei, Los Gatos, CA (US); John Chen, Rowland Hieghts, CA (US)

(73) Assignee: Finisar Corporation, Sunnyvale, CA (US)

( * ) Notice: Subject to any disclaimer, the term of this patent is extended or adjusted under 35 U.S.C. 154(b) by 694 days.

This patent is subject to a terminal disclaimer.

(21) Appl. No.: 10/693,795

(22) Filed: Oct. 24, 2003

(65) Prior Publication Data

US 2006/0187454 A1 Aug. 24, 2006

Related U.S. Application Data

(60) Provisional application No. 60/422,069, filed on Oct. 28, 2002.

(51) Int. Cl.
*G01B 11/26* (2006.01)
(52) U.S. Cl. ..................................... 356/153
(58) Field of Classification Search .................. 356/153
See application file for complete search history.

(56) References Cited

U.S. PATENT DOCUMENTS

| 4,201,473 | A | * | 5/1980 | Domenicali et al. ......... 356/514 |
|---|---|---|---|---|
| 4,215,937 | A | * | 8/1980 | Borsuk ....................... 356/73.1 |
| H315 | H | * | 8/1987 | Genco et al. ................. 356/125 |
| 4,749,250 | A | * | 6/1988 | Carter .......................... 385/52 |
| 4,915,470 | A | * | 4/1990 | Moore et al. .................. 385/94 |
| 5,195,155 | A | | 3/1993 | Shimaoka et al. |
| 5,621,831 | A | * | 4/1997 | Staver et al. ................... 385/33 |
| 5,666,450 | A | * | 9/1997 | Fujimura et al. .............. 385/93 |
| 5,787,215 | A | * | 7/1998 | Kuhara et al. ................. 385/88 |
| 5,963,696 | A | * | 10/1999 | Yoshida et al. ................ 385/91 |
| 6,901,095 | B2 | * | 5/2005 | Tsunetomo et al. ...... 372/43.01 |

OTHER PUBLICATIONS

U.S. Appl. No. 10/693,773, filed Oct. 24, 2003, Chen et al.

* cited by examiner

*Primary Examiner*—Tarifur R. Chowdhury
*Assistant Examiner*—Isiaka O Akanbi
(74) *Attorney, Agent, or Firm*—Workman Nydegger (57) ABSTRACT

A photonic device package with a passively aligned lens cap is disclosed. The lens cap is positioned with an unobstructed view of the lens portion of the lens cap. A header holding a photonic device, is moved relative to the cap or vice versa until the video display system indicates that the photonic device is aligned to the lens. The cap is held in alignment by forming at least one weld point between the cap and the header. A subsequent hermetic sealing process can be used to permanently seal the cap to the header.

18 Claims, 8 Drawing Sheets

PHOTONIC DEVICE PACKAGE WITH ALIGNED LENS CAP

CROSS-REFERENCE TO RELATED APPLICATIONS

The present application claims priority to and the benefit of U.S. Provisional Patent Application No. 60/422,069, filed on Oct. 28, 2002, and entitled "Photonic Device Package with Aligned Lens Cap", which is incorporated herein by reference in its entirety.

BACKGROUND OF THE INVENTION

1. The Field of the Invention

The present invention relates generally to the packaging of photonic devices, such as lasers or detectors. More particularly, the present invention relates to aligning a lens of a cap and a photonic device of a photonic device package.

2. The Relevant Technology

Figure 1:
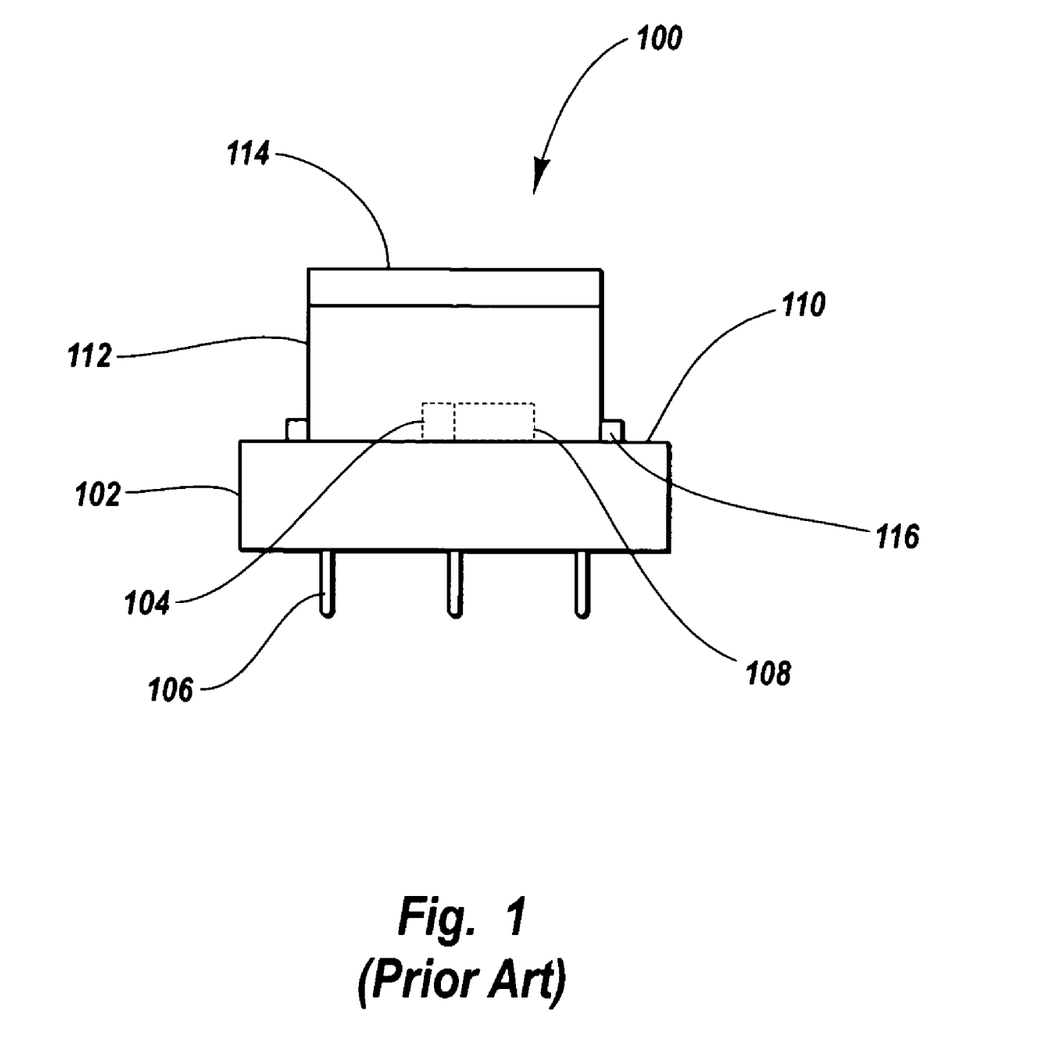
FIG. 1 is a side view of a prior art photonic device package having a header and a cap with a flat window.

Referring to FIG. 1, a common package design 100 for a photonic device 104, such as a laser, includes a header 102, such as a TO header, and a cap 112 with a flat window 114 for coupling light between package 100 and at least one other optical element, such as an optical fiber. Header 102 typically includes pins 106 for feeding electrical signals through appropriate insulating feedthroughs, such as a glass or ceramic region. Header 102 typically includes a region 108 for mounting photonic device 104, sometimes known as a "stem". For example, if photonic device 104 is an edge-emitting laser, the laser is mounted onto the stem using a laser submount. The header includes a baseplate 110 having a comparatively flat annular region that forms a seating surface for bonding a lip region 116 of cap 112 to header 102.

In some applications it is desirable to replace flat window 114 of cap 112 with a micro-lens. The micro-lens can be selected to improve the optical coupling of photonic device 104 in package 100 with an exterior optical element. For example, if photonic device 104 in package 100 is a laser, a micro-lens can be integrated in cap 112 to improve the optical coupling of the laser to an optical fiber, optical waveguide, or other optical device used to transmit the optical signal generated by the laser.

Incorporating a lens into cap 112 has the drawbacks that the packaging cost tends to increase and that the laser yield tends to decrease. Header 102 and cap 112 are typically formed using a manufacturing process with comparatively poor mechanical tolerances compared with optical dimensions. Consequently, an active alignment process is required to align the cap to the laser prior to a hermetic sealing process. In an active alignment process, the output of package 100 is optimized with the photonic device in an active state. For example, if the photonic device is a laser, the light output of the laser is monitored outside of the package (e.g., using an optical detector) and the cap is positioned with actuators until the output of the laser is optimized.

However, active alignment techniques have several drawbacks. First, active alignment is more expensive than desired, in part due to the numerous measurements required to determine an optimum cap position. Additionally, the mechanical apparatus to position and hold the cap in place during final sealing requires accurate alignment actuators that increase the cost of the system. Moreover, slippage can occur after alignment during final sealing of the cap, resulting in reduced yield.

BRIEF SUMMARY OF THE INVENTION

Disclosed is a method of passively aligning a lens cap to a photonic device header. A package for a photonic device includes a header and a lens cap having an integrated lens. The photonic device is mounted to the header. A display system is used to view the photonic device through the lens of the cap. The header is held by a chuck and the cap is moved, relative to the header, until an optical axis of the photonic device is aligned to the optical axis of the lens within a preselected calibration factor. Using a camera with a high magnification lens accomplishes the alignment. One or more welding points hold the cap in place during a subsequent sealing process. In one embodiment, the cap is positioned by a conductive arm having an opening for viewing the lens. In this embodiment, applying a voltage between a lip of the conductive cap and the header forms the weld points that weld the cap to the header.

The present invention allows quick aligning of the cap using passive alignment where the photonic device remains inoperable during the alignment process. A header and cap can be loaded and positioned into alignment in a few seconds or less. This results in reduced packaging costs and higher throughput as compared with conventional active alignment techniques.

Additionally, alignment uses comparatively inexpensive apparatus. Many of the individual components of the alignment system, such as movable stages and video display systems, are comparatively low-priced components. Since the alignment technique is passive, the expenses of operating the laser and providing a photo diode or other optical reader to use in the alignment process are eliminated.

Additionally, this technique achieves high manufacturing yield. Yields of resistively welded devices having acceptable alignment can approach 100%. After the resistive welding is completed, the alignment can be checked using a video display system and, if necessary, the cap removed and the process repeated.

These and other objects and features of the present invention will become more fully apparent from the following description and appended claims, or can be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

The present invention relates generally to devices, systems, and methods for aligning a lens of a lens cap to a photonic device of a photonic device package. The present invention also relates to methods, systems, and devices for creating a sealed photonic device package having a lens cap aligned to the photonic device. The present invention facilitates reductions in photonic device package manufacturing cost and time through eliminating active state testing of photonic device packages.

Figure 2A:
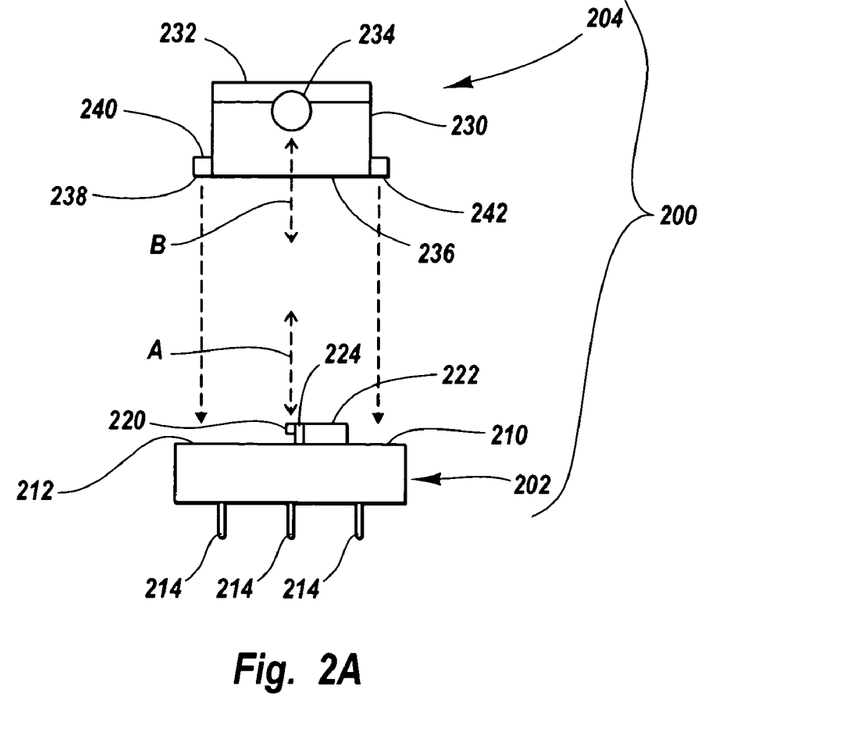
FIG. 2A is an exploded side view of an exemplary photonic device package including a header and a cap having an integrated lens according to one aspect of the present invention.
Figure 2B:
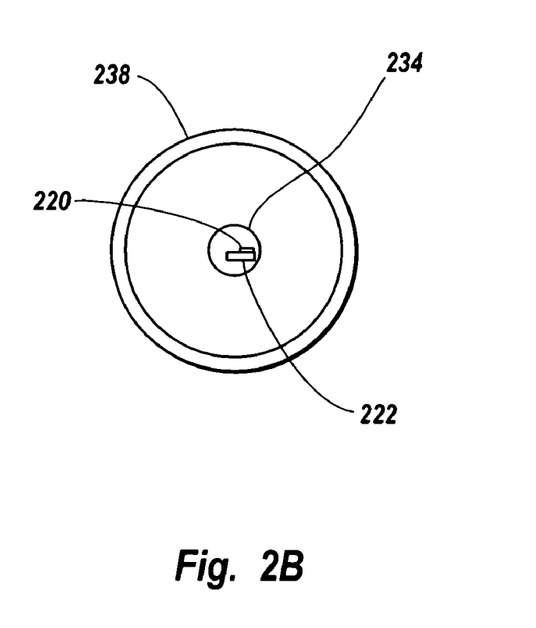
FIG. 2B is a top view of the exemplary photonic package of FIG. 2A.

Referring to FIG. 2A, depicted is an optical package 200 having a header 202 and a cap 204. Header 200 can include various types of optoelectronic components such as a transistor outline package (TO) or a receiver package having a photo detector. In the illustrated configuration, header 202 includes a base plate 210 of a conductive metal that has a region 212 that cooperates with cap 204. Region 212 can include recesses, protrusions, or other structures that aid with positioning cap 204 relative to header 202 and aid with seating cap 204 thereto. In the illustrated configuration of FIGS. 2A and 2B, header 202 is generally circular and so has an annular region 212. One skilled in the art will understand, however, that various other configurations are possible, such as, but not limited to, polygonal, oval, curved, or other configurations so long as base plate 210 of header 202 cooperates with cap 204.

Extending from this region 212 and through base plate 210 are feedthroughs 214. These feedthroughs 214 provide electrical connections to the optoelectronic components mounted to header 202, such as, but not limited to a photonic device 220 and/or an associated stem 222. The feedthroughs 214, in one configuration, can be disposed proximate stem 222 in an insulating region (not shown) of header 202.

Mounted to header 202 is stem 222 that receives photonic device 220. Photonic device 220 can be any device that generates or receives light passing through cap 204. For instance, photonic device 220 can be a laser diode or a photodiode depending upon the type of optoelectronic package forming package 200. An optical axis A of photonic device 220 corresponds to the axis of the emitted beam. This optical axis A is dependent upon whether photonic device 220 either transmits or receives a beam of light. The optical axis A, therefore, is either the optical axis of an emitted beam from photonic device 220 or the optical axis of a beam received by photonic device 220, such as the surface normal of a photo detector. In one embodiment, photonic device 220 is an edge-emitting semiconductor laser. More generally, however, photonic device 220 can comprise other types of photonic devices, such as a vertical cavity surface emitting laser (VCSEL), an optical detector, a surface-emitting light emitting diode (LED) or an edge emitting LED.

As illustrated, interposed between photonic device 220 and stem 222 is an intermediate layer 224. This intermediate layer 224 functions as a sub-mount or a cooler for photonic device 220.

Disposable upon header 202 is cap 204. The cap 204 includes a body 230 upon which is mounted a window 232 and at least one lens 234. While lens 234 can be part of window end 232, an additional window layer can cover lens 234, such as by a layer of an optically transparent medium, such as a layer of a glass, optical grade plastic, or other suitable optical material. In a packaged device, it is desirable that an optical axis B of lens 234 aligns with optical axis A of photonic device 220, since this improves optical coupling.

Cap 204 has a lip 238 about a bottom receptacle end 236. Lip 238 has an upper lip region 240 and an opposed bottom lip region 242. The lip 238 cooperates with region 210 so that cap 204 mounts to header 202. Various configurations of lip 238, and more generally bottom receptacle end 236 of cap 204, are possible, so long as the structure or configuration is complementary to region 210 or header 202 of photonic device package 200.

Fabrication of body 230 and lip 238 uses a variety of materials so long as such materials are compatible with mounting of window 232 and lens 234 thereto. For instance, metals, plastics, polymers, synthetic material, natural materials, combinations thereof, or other materials that can function with the desired optical and thermal characteristics of a cap for a photonic device package, can form body 230 and lip 238.

Lens 234 of cap 204 can be any suitable micro-lens. Selecting the focal length, numerical aperture, and separation distance with respect to photonic device 220, in accord with conventional principles of optics, optimizes the optical coupling to photonic device 220. For example, photonic device 220 can be a semiconductor laser. With an optimized separation distance and focal length, the output of the laser can be coupled into an optical fiber with improved coupling efficiency. Alternately, when photonic device 220 is a photodiode, the selected focal length, numerical aperture, and separation distance of lens 234 can improve optical coupling of the input beam to the photo diode.

Lens 234 can be a ball lens, also sometimes known as a spherical ball micro-lens or a spherical micro-lens. A ball lens can have a diameter between about 1.0 millimeters to 5.0 millimeters. A ball lens can be manufactured from a variety of materials, such as silica, silicon, sapphire or other types of high index glasses such as BK7. The refractive index of a ball lens is typically between about 1.45 to about 3.5. For a particular application, the refractive index and diameter of the ball lens are selected to achieve a desired numerical aperture and focal length of the lens.

Figure 3:
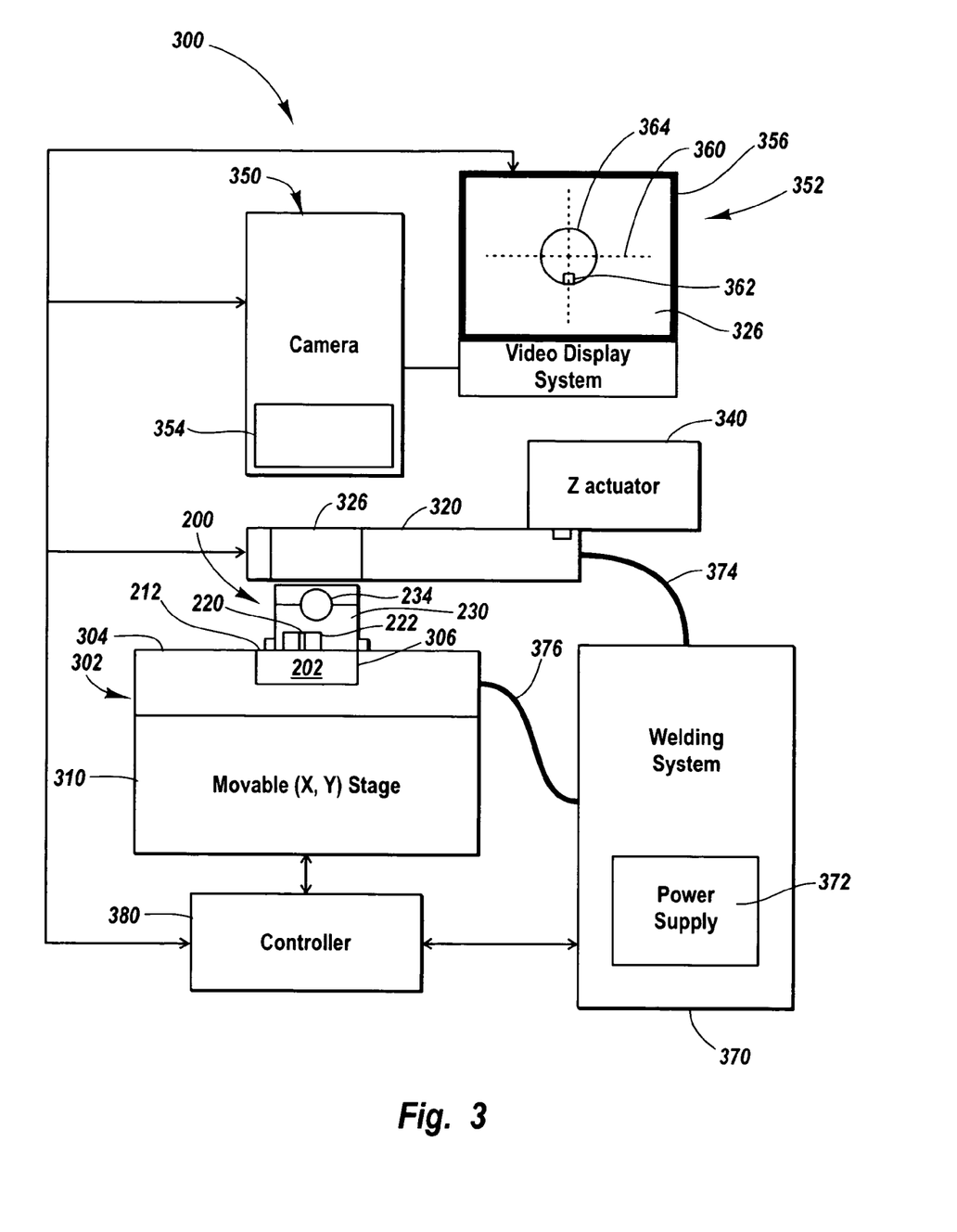
FIG. 3 shows an embodiment of an exemplary system for aligning the cap and photonic device.

FIG. 3 illustrates one exemplary configuration of an alignment system 300 in accordance with the present invention. Aligning of cap 204 to header 202 is possible using alignment system 300. As illustrated, alignment system 300 includes a capture assembly 302 that receives header 202. This capture assembly 302 includes a chuck 304 and associated locking mechanism (not shown). The chuck 304 includes, in one configuration, appropriately shaped holes or recesses to receive feedthroughs 214 or other electrical pins (See FIG. 2A) of header 202. Chuck 304 engages the bottom and/or sides of base plate 210. Chuck 304 can include one or more pieces to facilitate attaching or mounting of header 202 within recess 306.

A locking mechanism (not shown) cooperates with chuck 304 to lock header 202 within recess 306. The locking mechanism can include pins, screws, latches, levers, gear, or other suitable locking mechanisms that results in mechanical engagement of header 202 with chuck 304 or application of sufficient force upon header 202 to prevent movement of header 202 during the manufacturing process. In one configuration, the locking mechanism includes chuck 304 in that chuck 304 includes a pneumatic locking mechanism to use air pressure to lock and unlock header 202. Alternatively, hydraulic and/or mechanical locking mechanisms lock and unlock header 202. Similarly, combinations of different types of pneumatic, hydraulic, and/or mechanical locking mechanisms lock and unlock header 202, whether such locking mechanisms include or exclude chuck 304.

The capture assembly 302 mounts to a movable stage or structure 310. This moveable structure 310 moves capture assembly 302 and hence the supported header 202 during the manufacturing process using various mechanical, pneumatic, hydraulic, or other devices and structures as known to those skilled in the art. For instance, pneumatic or hydraulic rams can move chuck 304 in the x-direction, y-direction, and/or the z-direction. Although reference is made to movement of chuck 304 in the x-direction, y-direction, and/or the z-direction, one skilled in the art will appreciate that chuck 304 can remain in a constant position, while other components of system 300 move relative to chuck 304.

Figure 4:
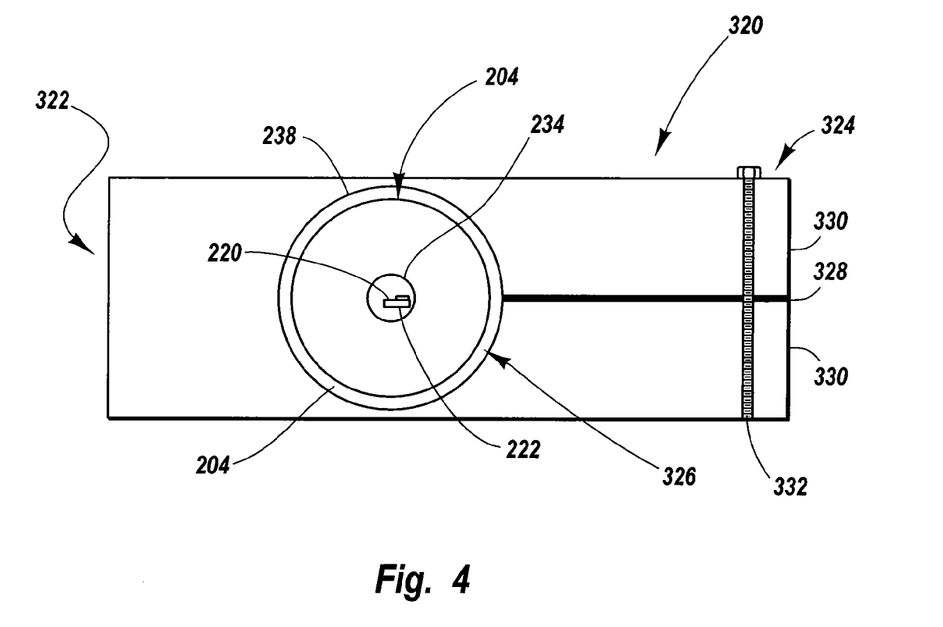
FIG. 4 illustrates the arm of the exemplary system of FIG. 3 engaging the cap, according to one aspect of the present invention.

To aid with positioning cap 204 onto header 202, system 300 includes moveable arm 320. This arm 320, as illustrated in FIG. 4, has a first end 322 and a second end 324. Disposed at first end 322, or at some location between first end 322 and second end 324, is an opening 326 shaped to engage body 230 and/or lip 238 of cap 204. The arm 320 accommodates cap 204 while leaving all or part of lens 234 unobstructed from view. This permits viewing of photonic device 220 through lens 234, as will be described in more detail hereinafter.

At second end 324 and extending toward opening 326 is a channel 328 that separates a portion of arm 320 into two sections 330. Portions of these sections 330 are movable relative to the remainder of arm 320, i.e., the portions of arm 320 without channel 328. Sufficient separation exists between sections 330 to allow opening 326 to receive cap 204. Upon reducing the separation provided by channel 328, such as by movement of a screw 332, arm 320 clamps body 230 of cap 204 to securely retain cap 204 within opening 326. Although reference is made to use of screw 332, one skilled in the art will appreciate that the use of other mechanical, pneumatic, or hydraulic structures or devices, including combinations thereof, is possible.

Returning to FIG. 3, arm 320 cooperates with an actuator 340. This actuator 340 moves arm 320 relative to header 204. Consequently, actuator 340 can pivot and move cap 204 in the x-direction, y-direction, and/or z-direction so that cap 204 mounts to header 204. Various devices can perform the function of actuator 340.

To aid with accurately positioning or aligning cap 204 with respect to header 202 and photonic device 220, system 300 includes a camera system 350 and a video display system 352. Camera 350 is disposed above arm 320 to view lens 234 through opening 326 of arm 320. Any suitable camera having sufficient magnification to view photonic device 220 through lens 234 can function as camera 350. For example, a video camera or a video imaging system with an optional built-in zoom lens 354 can function as camera 350. Alternatively, additional optics (not shown) coupled to camera 350 provide the desired optical magnification. The desired magnification will depend, in part, upon the optical characteristics of lens 234, the separation of camera 350 from lens 234, and the desired alignment accuracy. For example, a camera zoom magnification of about thirty can be sufficient because ball lens 234 increases the effective magnification of the combined zoom lens/ball lens system.

Camera 350 provides a video input to video display system 352 having a video monitor 356 and control electronics (not shown). The focus of camera 350 permits simultaneous imaging of photonic device 220 and the outline of lens 234. For a ball lens, lens 234 appears as a circular-shaped region and has an optical axis disposed at its center. Photonic device 220 typically has a rectangular-shape associated with its die.

Video display system 352 also includes a video calibration pattern 360 that can be superimposed, such as a calibrated circle or cross-hairs, to determine an acceptable separation of an image 362 of photonic device 220 relative to an image 364 of lens 234. The calibration pattern 360 includes an indicator of a pre-selected maximum separation distance between the center of lens 234 and photonic device 220. The maximum separation distance, for example, can be determined from principles of optics or by performing calibration tests. A suitable keyboard or control knobs can be used to adjust the position of the superimposed video pattern.

Figure 5:
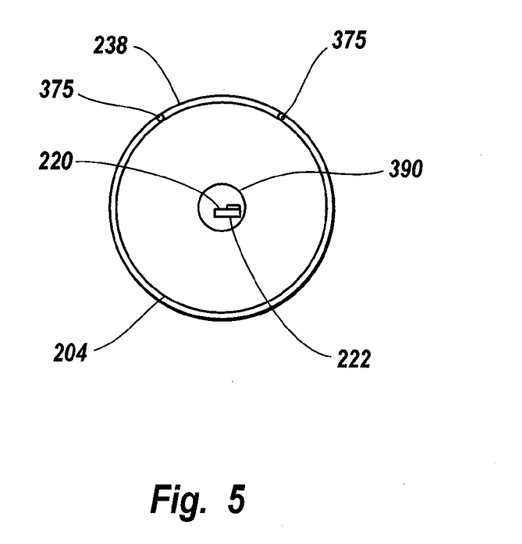
FIG. 5 shows a top view of a cap with resistive welds formed by passing a current between the header and the cap using the arm of FIGS. 3 and 4.

To attach cap 204 to header 202 system 300 includes a welding system 370, and associated power supply 372. The welding system 370 functions to form a weld between cap 204 and header 202. Welds formed by welding system 370 prevent movement of cap 204 relative to header 202 during the hermetic sealing process. Welding system 370, in this exemplary configuration, is a resistive welding system. The system 370 electrically communicates with arm 320 by way of connector 374 and capture assembly 302 by way of connector 376. In this manner, formation of an electrical path occurs that results in current flowing from welding system 370, to cap 204, to header 202, and returning to welding system 370. As current flows, tack-welds 375 form between cap 204 and header 202, as illustrated in FIG. 5. Although reference is made to the use of resistive welding system, any technique for forming one or more weld points can be used, such as a localized laser weld or a spot arc weld.

With continued reference to FIG. 3, in a resistive welding process, two materials fuse under the application of a sufficient pressure and current. A voltage drop occurs between cap 204 and header 202. More specifically, a voltage drop occurs between lip 240 of cap 204 and base plate 210 of header 202. Arm 320 applies a suitable pressure between lip 240 of cap 204 and header 202. A selected current/voltage pulse generated by power supply 372 provides sufficient energy to fuse at least one point along lip 240 of cap 204. The voltage, current, and time for the current/voltage pulse can be selected empirically. In one embodiment, performance of the resistive welding occurs at a voltage of 0.9 volts, a current of 0.5 amps, and for a period of 300 milliseconds. One of skill in the art will realize that other voltage, current and time parameters can be used, as long as lip 240 becomes spot welded to header 202.

The resistive welding process does not have to form a complete seal around lip 240 of cap 204 but need only include a sufficient number of resistively welded points on lip 240 of cap 204 to temporarily fix cap 204 into alignment. At least one welding point is desired, although a more mechanically stable configuration results if two or more welds form. This resistive welding step is a "tack-in" welding step in that it need only have sufficient mechanical strength to hold the cap into place for a subsequent sealing process.

A control system 380 controls the operation or functions of one or more of the systems or devices of system 300. In one configuration, control system 380 moves stage 310 relative to arm 320. For example, control system 380 can include (x, y, z) control knobs enabling an operator to move stage 310 relative to arm 320. Alternatively, control system 380 brings cap 204 into coarse alignment, with fine alignment adjustments made by hand by a human operator. In another configuration, control system 380 manages formation of welds between cap 204 and header 202. In still another configuration, control system 380 manages movement of camera 350 and presentation of images using video display system 352. It will be understood by one skilled in the art that control system 380 can perform one or more of the above functions under the control of one or more programs or software applications stored at control system 380.

Figure 6:
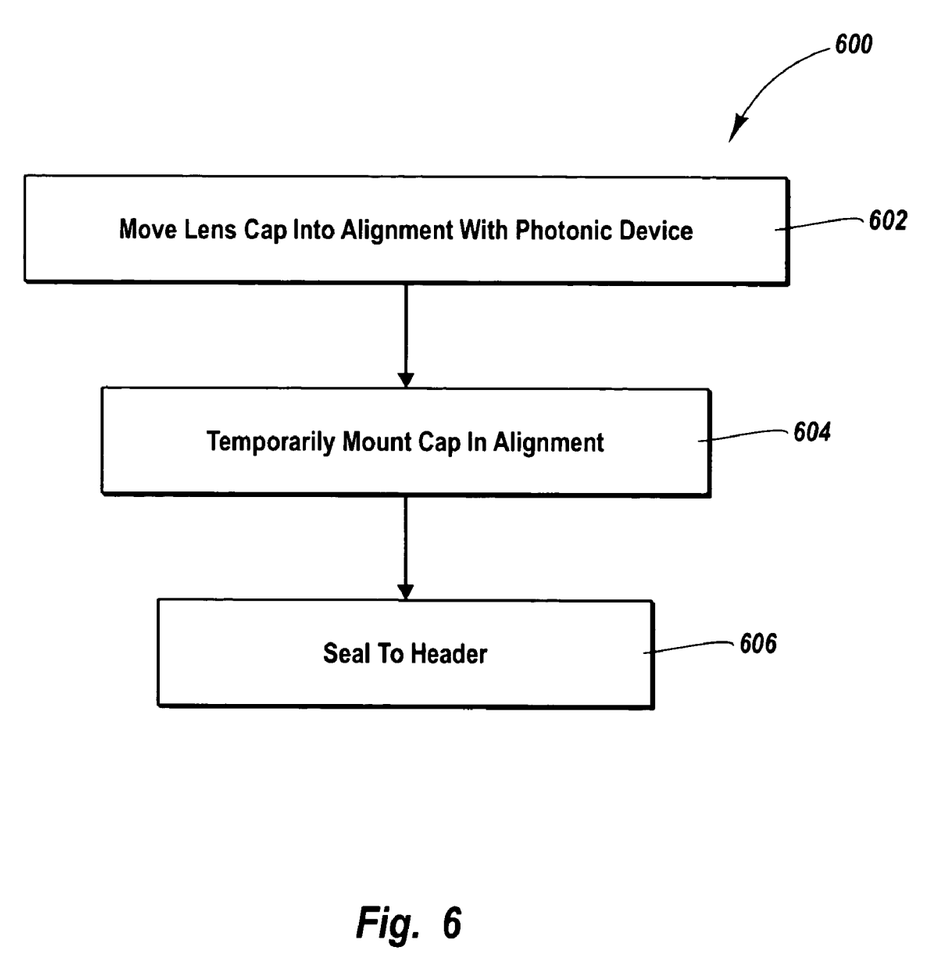
FIG. 6 is a flow chart of an exemplary technique of packaging a photonic device according to one aspect of the present invention.

FIG. 6 is a generalized description of one method 600 of packaging a photonic device according to one aspect of the present invention. The method includes, moving the lens cap into alignment with the photonic device, as represented by block 602. As outlined above, this movement can be accomplished automatically, manually, or by a combination of automatic and manual movement. This step can include the use of crosshairs or other alignment tools to ensure a proper alignment between the cap and the header. Further, the step may include one or more other intermediate steps, such as, but not limited to, mounting the header within the chuck, mounting the cap to the arm, and aligning the optical axes by moving the arm and/or the stage. Alternatively, the method can include mounting the cap to the header such that the optical axes approximately align and moving the arm relative to the stage and/or the stage relative to the arm until the optical axes align.

Once the lens is in proper alignment with the photonic device, the cap is temporarily mounted with the desired alignment, as represented by block 604. This can include tack welding at least one point to hold the cap into alignment. If desired, the alignment can be double-checked after tack welding to confirm that it has not changed during the tack-in welding process.

The cap is then sealed to the header to form a permanent weld, as represented by block 606. For example, if a hermetical seal is required after the tack-in weld process, the cap is permanently welded to the header in environmental conditions (e.g., temperature and ambient gas conditions) appropriate for a hermetical sealing process. This step can be performed ensuring an airtight fit between the cap and header. If desired, the alignment can be double-checked after the final welding is complete to confirm that there has been no change.

Figure 7:
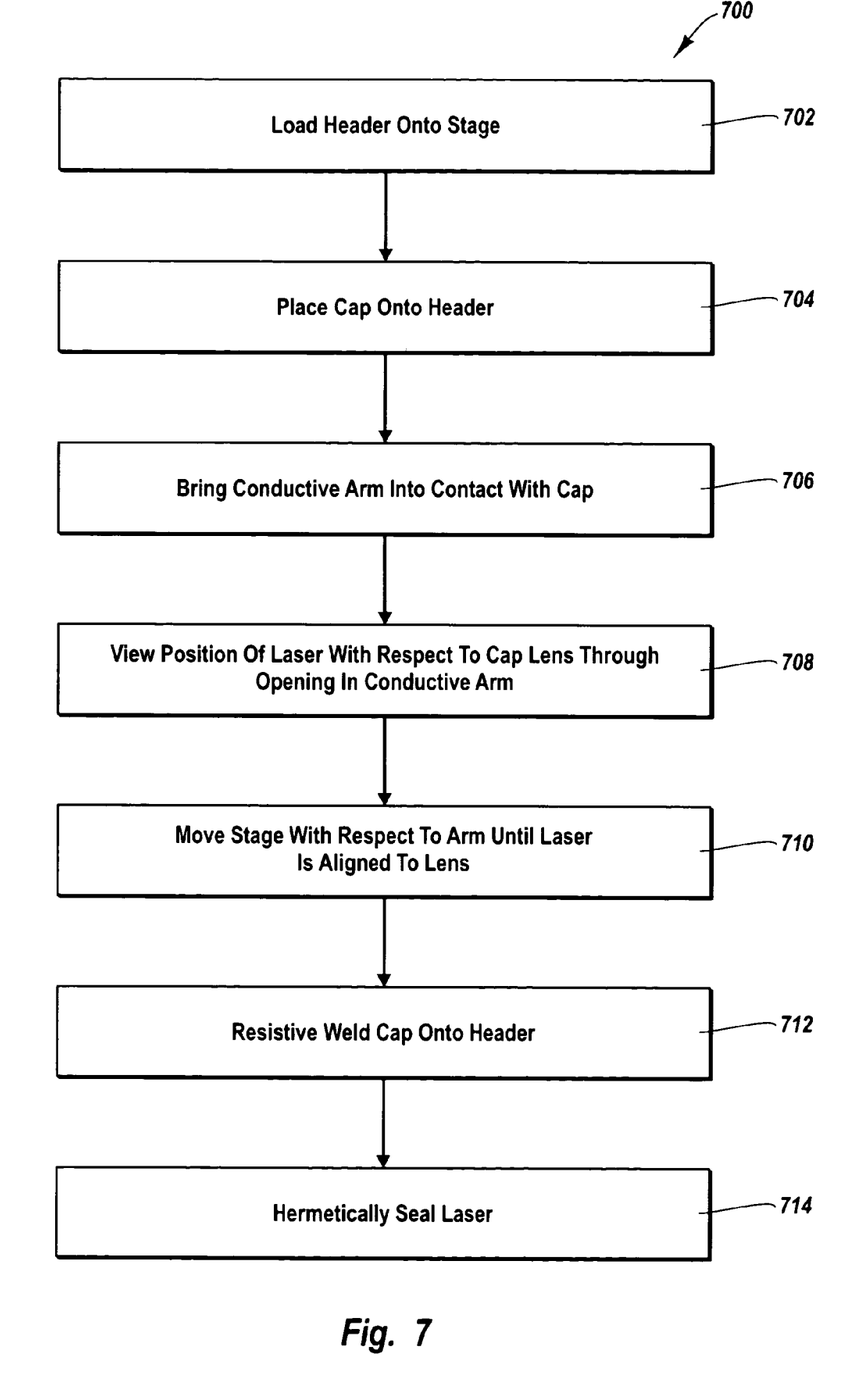
FIG. 7 is a flow chart of an exemplary technique of packaging a laser according to another aspect of the present invention.

FIG. 7 is a flow chart illustrating a more detailed representation of one method 700 of packaging a photonic device in accordance with the present invention. The header is loaded on the stage, as represented by block 702. The cap is placed onto the header in an approximate position, as represented by block 704 and illustrated in FIG. 3. Following approximate positioning of the cap, the arm is brought into engagement with the cap, as represented by block 706 and illustrated in FIG. 8. Clamping the arm to the cap through use of the screw (FIG. 4) accomplishes this.

Figure 8:
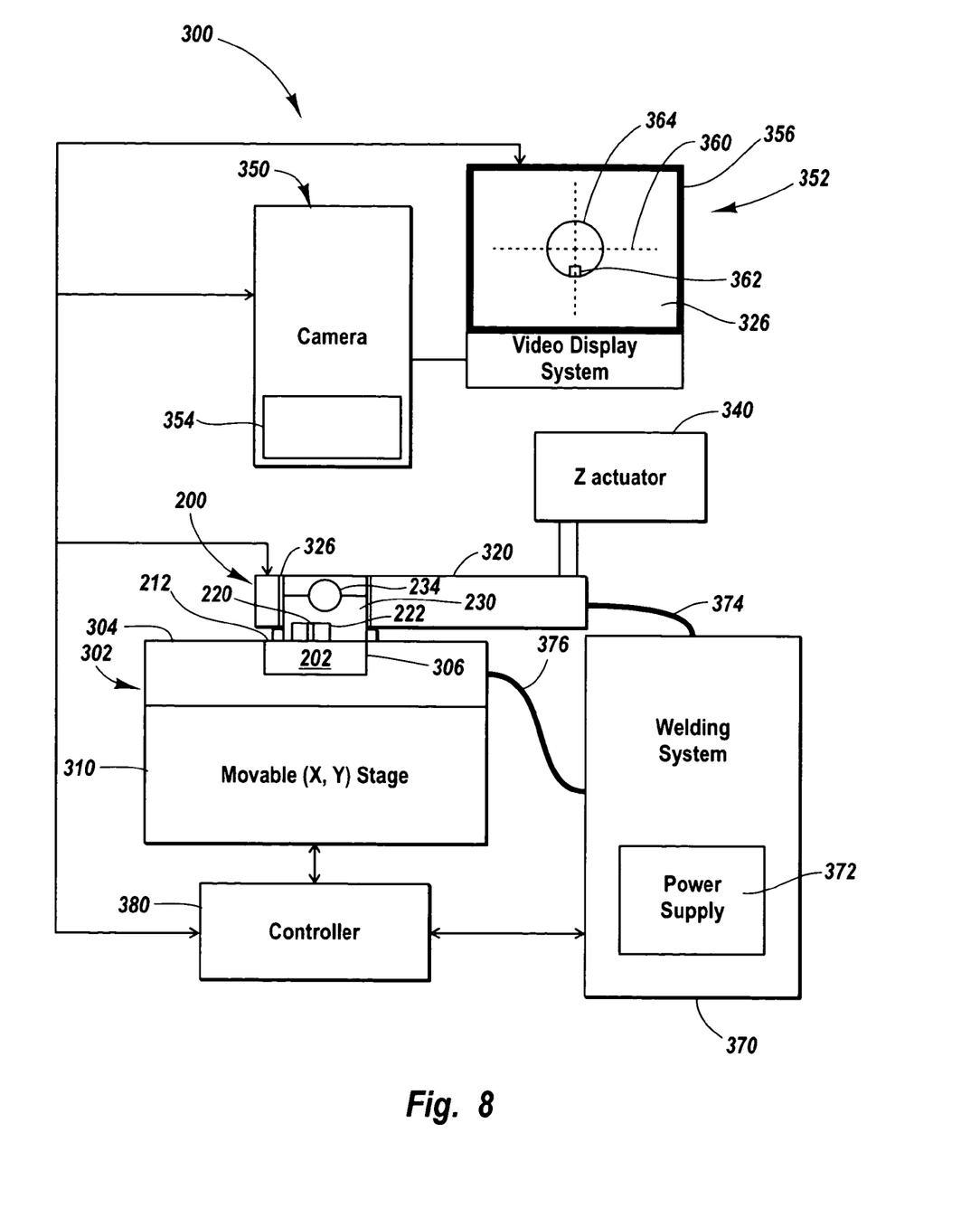
FIG. 8 illustrates the system of FIG. 3 showing the lens of the cap and the emitting region of the chip on the header misaligned in the video display system.

Following clamping of the cap, the position of the photonic device with respect to the center of the cap lens is viewed through the opening in the arm, as represented by block 708. As shown in FIG. 8, the display of the video display system illustrates the displacement of the photonic device relative to the lens of the cap. As illustrated, video display system 352 may initially show image 362 of photonic device 220 to be out of acceptable alignment with image 364 of lens 234.

Figure 9:
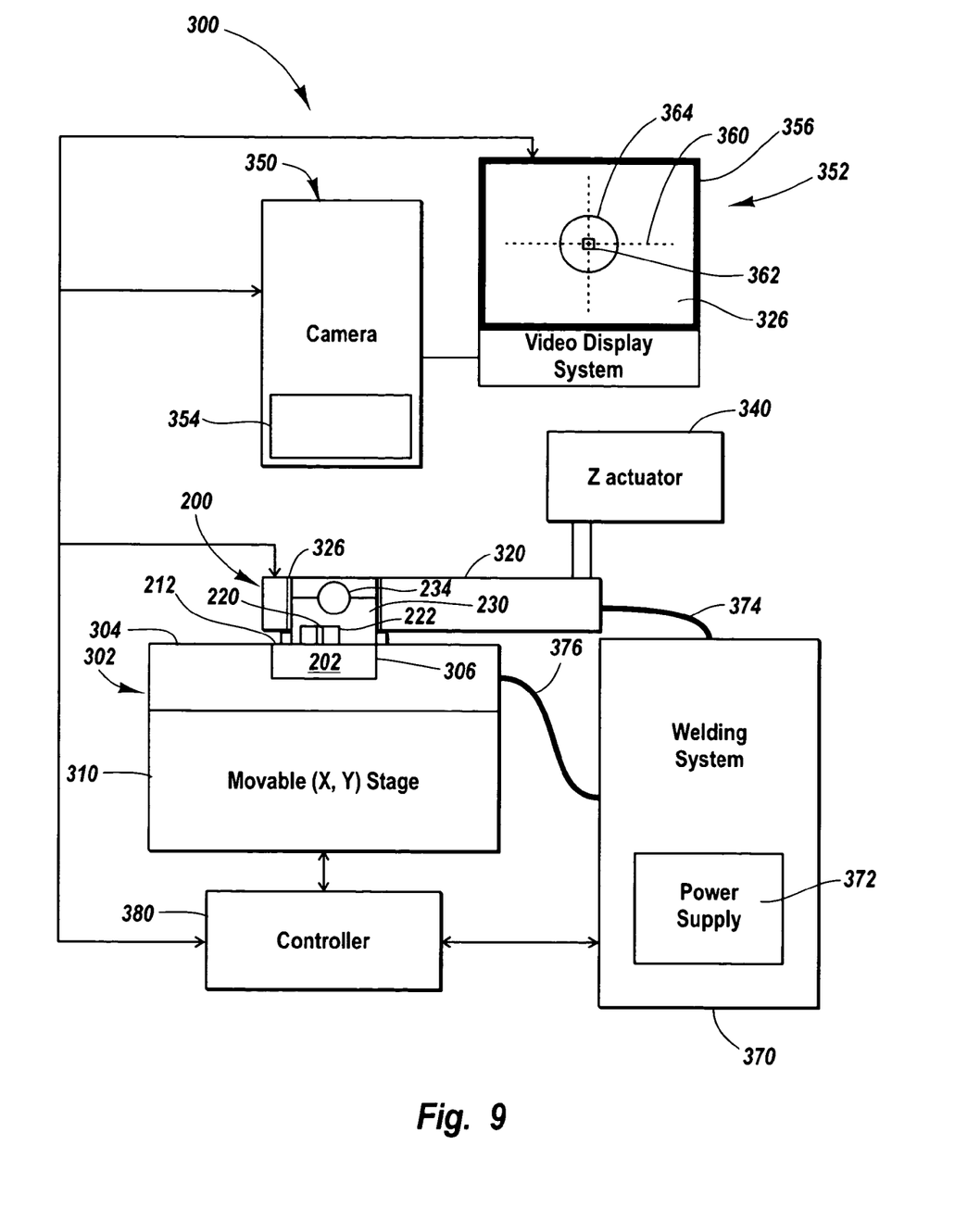
FIG. 9 illustrates the system of FIG. 3 with the cap moved into alignment prior to resistive welding.

Returning to FIG. 7, the stage is moved with respect to the arm until the photonic device is aligned to the optical axis of the lens, as represented by block 710 and illustrated in FIG. 9, as the image representation of photonic device 362 and image representation of lens 364 axially align. With continued reference to FIG. 7, once the cap is aligned, the cap is resistively welded to the header, as represented by block 712. The arm is then disengaged and the header and cap removed. Finally, if desired, the package is then hermetically sealed, as represented by block 714.

While the present invention has been described in detail in regards to a lens cap having a single lens, it will be understood that the present invention can also be applied to a cap having an optical assembly including more than one lens. Additionally, it will be understood, therefore, that the single lens can be replaced by an optical lens assembly that can include additional optical components (e.g., an optical isolator).

Further, the present invention can be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of aligning a cap having a lens to a header holding a photonic device, the method comprising:
   a step for viewing, through said lens, a displacement of a first optical axis of said lens relative to a second optical axis of said photonic device;
   a step for moving said cap relative to said header to position said first optical axis of said lens proximate said second optical axis of said photonic device; and
   a step for mounting said cap to said header to hold said cap in alignment with said photonic device, wherein said steps are performed with said photonic device in an inactive state.

2. The method of claim 1, further comprising a step for hermetically sealing said cap to said header.

3. The method of claim 2, wherein said step for viewing comprises a step for viewing said photonic device by a video display system.

4. The method of claim 3, further comprising a step for overlaying a calibration pattern on said video display.

5. The method of claim 4, further comprising a step for moving said cap relative to said header until a center of said lens is within a preselected calibration distance of said photonic device.

6. The method of claim 1, wherein said step for moving said cap relative to said header comprises:
   a step for positioning said header for movement in at least two of an x-direction, a y-direction, and a z-direction;
   a step for positioning said cap for movement in at least two of an x-direction, a y-direction, and a z-direction; and
   a step for moving at least one of said header and said cap in at least one of an x-direction, a y-direction, and a z-direction.

7. The method of claim 1, wherein said step for mounting said cap comprises a step for welding said cap to said header at at least one point.

8. A packaged optical device assembled according to the method of claim 1.

9. The method of claim 1, wherein said photonic device is a laser.

10. The method of claim 1, wherein said photonic device is a photo diode.

11. The method of claim 1, wherein said lens comprises a ball lens.

12. The method of claim 1, wherein said photonic device comprises an optical detector.

13. An apparatus to align a cap having a lens with a first optical axis to a header holding a photonic device with a second optical axis, said apparatus comprising:

a capture assembly adapted to hold said header having said photonic device, said capture assembly being movable relative to said cap having a lens;

an arm configured to support said cap, said arm being adapted to support said cap without obstructing a view of at least a portion of said lens; and a visual display system adapted to depict, without the use of light emitted from, or reflected by, said photonic device, a position of said cap relative to said photonic device as said capture assembly moves relative to said cap to align said first optical axis and said second optical axis.

14. The apparatus of claim 13, wherein said arm is adapted to move said cap in at least one of an x-direction, a y-direction, and a z-direction with respect to said header.

15. The apparatus of claim 14, further comprising at least one welding system, said at least one welding system in electrical communication with said arm and said capture assembly.

16. The apparatus of claim 13, wherein said video display system comprises at least one camera and at least one video display.

17. The apparatus of claim 16, wherein said camera further comprises a zoom lens.

18. The apparatus of claim 16, wherein said video display system includes a video overlay including at least one calibration feature for determining when the photonic device is within a preselected alignment tolerance with the lens.

* * * * *

UNITED STATES PATENT AND TRADEMARK OFFICE
CERTIFICATE OF CORRECTION

PATENT NO. : 7,456,945 B2  
APPLICATION NO. : 10/693795  
DATED : November 25, 2008  
INVENTOR(S) : Shih et al.

Page 1 of 3

It is certified that error appears in the above-identified patent and that said Letters Patent is hereby corrected as shown below:

Title Page
Item 75, Inventors, change "Rowland Hieghts" to --Rowland Heights--

Drawings
Sheet 4, replace FIG. 5 with the figure depicted below, wherein reference 390, which is never mentioned, is removed

Fig. 5

Signed and Sealed this
Twenty-eighth Day of December, 2010

David J. Kappos
*Director of the United States Patent and Trademark Office*

Column 1
Line 33, add --102-- after "The header"
Line 57, add --112-- after "the cap"
Line 63, add --112-- after "the cap"
Line 66, add --112-- after "the cap"

Column 2
Line 12, change "lens accomplishes the alignment" to --lens helps to accomplish the alignment--
Line 49, add --,-- after "thereof"

Column 3
Line 29, change "Header 200" to --Header 204--
Line 30, add --,-- after "components"
Line 31, add --,-- after "package"

Column 4
Line 5, change "Disposable" to --Disposed--
Line 6, add --,-- after "230"
Line 8, remove [end] after "window"
Line 9, change "such as by a" to --such as a--
Line 10, remove [a] before "glass"
Line 16, change "210" to --212--
Line 20, change "210" to --212--
Line 32, change "accord" to --accordance--
Line 41, change "photo diode" to --photodiode--
Line 47, add --,-- after "glasses"
Line 54, add --(FIG. 2A)-- after "204"
Line 60, change "(See" to --(see--
Line 62, add --(FIG. 2A)-- after "210"
Line 67, change "gear" to --gears--

Column 5
Line 8, add --may-- after "mechanisms"
Line 11, add --may-- before "lock"
Line 15, add --,-- after "302"
Line 15, add --,-- after "202"
Line 48, change "204" to --202--
Line 51, change "204" to --202--
Line 51, change "Various devices can" to --Various other devices can also--

Column 6
Line 20, add --260-- after "pattern"
Line 21, add --,-- after "202"
Line 22, change "system 370," to --system 370--
Line 31, change "that" to --and--
Line 35, add --370-- after "system"
Line 49, change "volts, a current of 0.5 amps," to --volts and a current of 0.5 amps--
Line 52, change "used," to --used--
Line 59, change "welding step in" to --welding step, in--

Column 7
Line 13, change "includes," to --includes--
Line 24, change "header" to --header,--
Line 25, change "align" to --align,--
Line 50, change "cap," to --cap through use of the screw 332 (FIG. 4),--
Lines 51 and 52, remove [Clamping the arm to the cap through use of the screw (FIG. 4) accomplishes this.]